(12) United States Patent
Wickstrum et al.

(10) Patent No.: US 10,963,207 B2
(45) Date of Patent: Mar. 30, 2021

(54) PORTABLE VIDEO SCREEN

(71) Applicant: GOVISION, LLC, Argyle, TX (US)

(72) Inventors: Todd Wickstrum, Argyle, TX (US);
Chris Curtis, Flower Mound, TX (US);
Kevin Faciane, Argyle, TX (US);
Bradley Merriman, Denton, TX (US)

(73) Assignee: GoVision, LLC, Argyle, TX (US)

( * ) Notice: Subject to any disclaimer, the term of this patent is extended or adjusted under 35 U.S.C. 154(b) by 0 days.

(21) Appl. No.: 16/957,016

(22) PCT Filed: Dec. 21, 2018

(86) PCT No.: PCT/US2018/067053
§ 371 (c)(1),
(2) Date: Jun. 22, 2020

(87) PCT Pub. No.: WO2019/126624
PCT Pub. Date: Jun. 27, 2019

(65) Prior Publication Data
US 2021/0004194 A1    Jan. 7, 2021

Related U.S. Application Data

(60) Provisional application No. 62/610,011, filed on Dec. 22, 2017.

(51) Int. Cl.
*G06F 3/14* (2006.01)
*F16M 11/38* (2006.01)
(Continued)

(52) U.S. Cl.
CPC ....... *G06F 3/1446* (2013.01); *F16M 11/2014* (2013.01); *F16M 11/38* (2013.01);
(Continued)

(58) Field of Classification Search
CPC .... G06F 1/1613; G06F 1/1615; G06F 1/1633; G06F 1/1637; G06F 1/1647–165;
(Continued)

(56) References Cited

U.S. PATENT DOCUMENTS 4,747,644 A   5/1988  Gallery et al.
5,128,662 A   7/1992  Failla
(Continued)

FOREIGN PATENT DOCUMENTS

WO    2014117103 A1    7/2014

OTHER PUBLICATIONS

International Search Report and Written Opinion dated Mar. 25, 2019 for Parent PCT Appl. No. PCT/US2018/067053.
(Continued)

*Primary Examiner* — Nathan Danielsen
(74) *Attorney, Agent, or Firm* — James E. Walton

(57) ABSTRACT

A portable video screen for displaying images utilizes a pivoting frame system for holding a plurality of LED panels. The portable video screen rotates on rolling video units to enable users to roll the video units through doorways and readily setup and tear down the portable video screens as needed. Folding handles rotate into and out of the system to enable users to move the video units without touching the LED panels.

17 Claims, 18 Drawing Sheets

Fig. 1E

(51) Int. Cl.
*H05K 5/02* (2006.01)
*F16M 11/42* (2006.01)
*H05K 5/00* (2006.01)
*F16M 11/20* (2006.01)
*F16M 13/02* (2006.01)

(52) U.S. Cl.
CPC ............ *F16M 11/42* (2013.01); *F16M 13/02* (2013.01); *H05K 5/0017* (2013.01); *H05K 5/0086* (2013.01); *H05K 5/0221* (2013.01)

(58) Field of Classification Search
CPC .......... G06F 3/14; G06F 3/1423–1446; G06F 2200/161; G06F 2200/1613; G06F 2200/1631; G06F 2200/1634; A47B 47/02–028; G09G 2300/02–026; G09G 2350/00; G09G 2352/00; G09G 2356/00; G09G 2380/06; H05K 5/0017; H05K 5/0086; H05K 5/0221; F16M 11/02; F16M 11/04; F16M 11/06; F16M 11/08; F16M 11/20–2078; F16M 11/38; F16M 11/42; F16M 13/02; G09F 9/302–3026; G09F 9/33
See application file for complete search history.

(56) References Cited

U.S. PATENT DOCUMENTS

| | | | |
|---|---|---|---|
| 5,434,631 | A | 7/1995 | Lieberman et al. |
| 5,900,850 | A | 5/1999 | Bailey et al. |
| 6,175,342 | B1 | 1/2001 | Nicholson et al. |
| 6,219,183 | B1 | 4/2001 | Doany |
| 8,231,185 | B1 | 7/2012 | Trusty |
| 9,004,430 | B2 | 4/2015 | Conner |
| 9,071,809 | B2 | 6/2015 | Cope et al. |
| 2001/0035411 | A1 | 11/2001 | Kofod |
| 2003/0001057 | A1* | 1/2003 | Sweere ............... G06F 1/1601 248/276.1 |
| 2004/0011938 | A1* | 1/2004 | Oddsen, Jr. .......... F16M 11/105 248/393 |
| 2005/0210722 | A1* | 9/2005 | Graef ..................... G09F 9/33 40/452 |
| 2006/0232496 | A1 | 10/2006 | Sato |
| 2006/0284037 | A1 | 12/2006 | Dittmer |
| 2007/0252919 | A1 | 11/2007 | McGreevy |
| 2008/0111929 | A1 | 5/2008 | Yokota et al. |
| 2008/0266206 | A1 | 10/2008 | Nelson et al. |
| 2009/0159768 | A1 | 6/2009 | Oh |
| 2009/0230271 | A1 | 9/2009 | Grabania |
| 2013/0119000 | A1 | 5/2013 | Carty |
| 2013/0271940 | A1 | 10/2013 | Cope |
| 2013/0279090 | A1 | 10/2013 | Brandt |
| 2014/0078685 | A1 | 3/2014 | Lee et al. |
| 2015/0136928 | A1* | 5/2015 | Fischer ............... B60R 11/0252 248/289.11 |
| 2015/0268916 | A1* | 9/2015 | Eisenberg ........... H04M 1/7253 455/566 |
| 2016/0307476 | A1 | 10/2016 | Cox et al. |
| 2016/0371047 | A1 | 12/2016 | Cope et al. |
| 2017/0090260 | A1 | 3/2017 | Yu et al. |
| 2017/0235535 | A1* | 8/2017 | Shen ................. H04N 1/00267 345/173 |
| 2018/0216777 | A1* | 8/2018 | Speicher ............ F16M 11/2021 |

OTHER PUBLICATIONS

International Preliminary Examination Report dated Apr. 6, 2020 for Parent PCT Appl. No. PCT/US2018/067053.

* cited by examiner

DETAIL A
SCALE 1/5

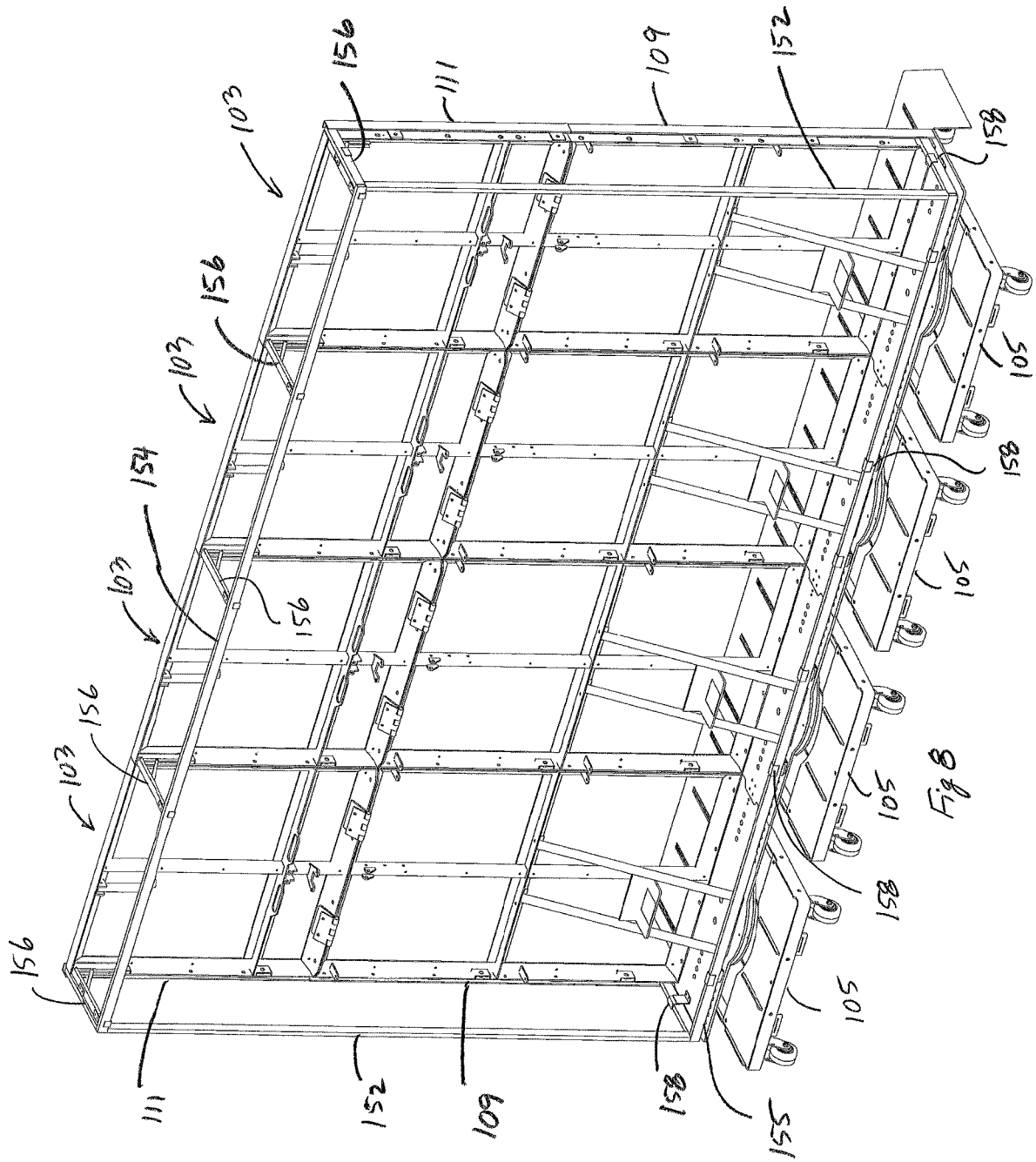

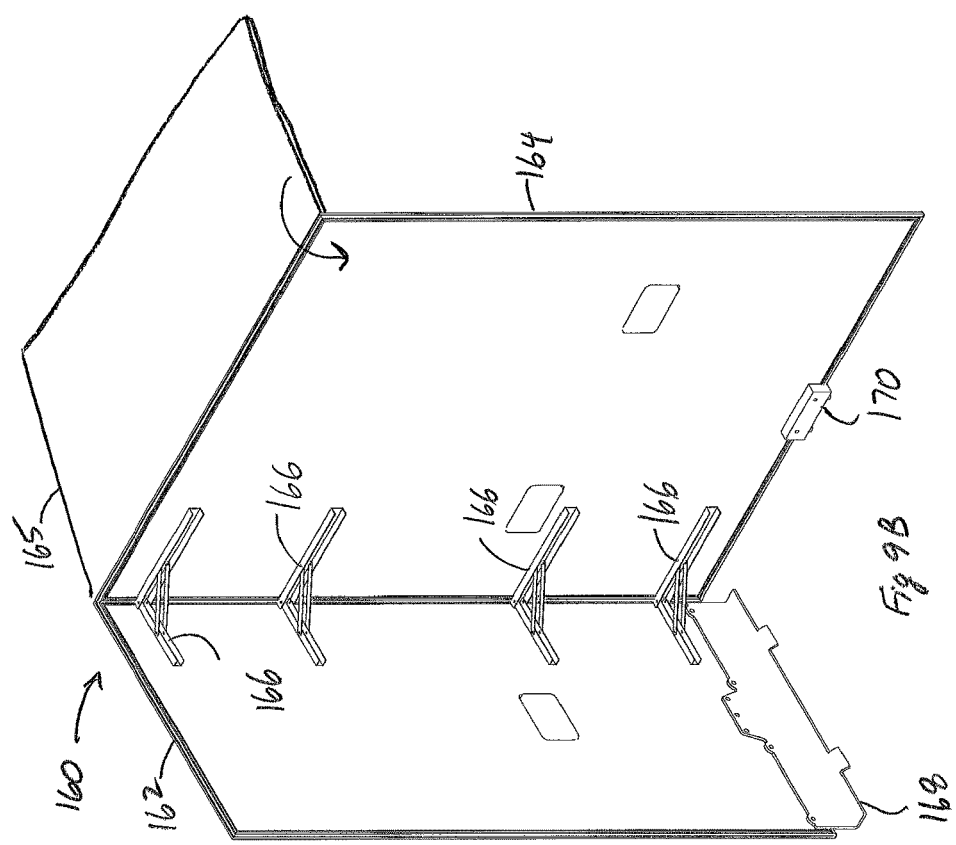
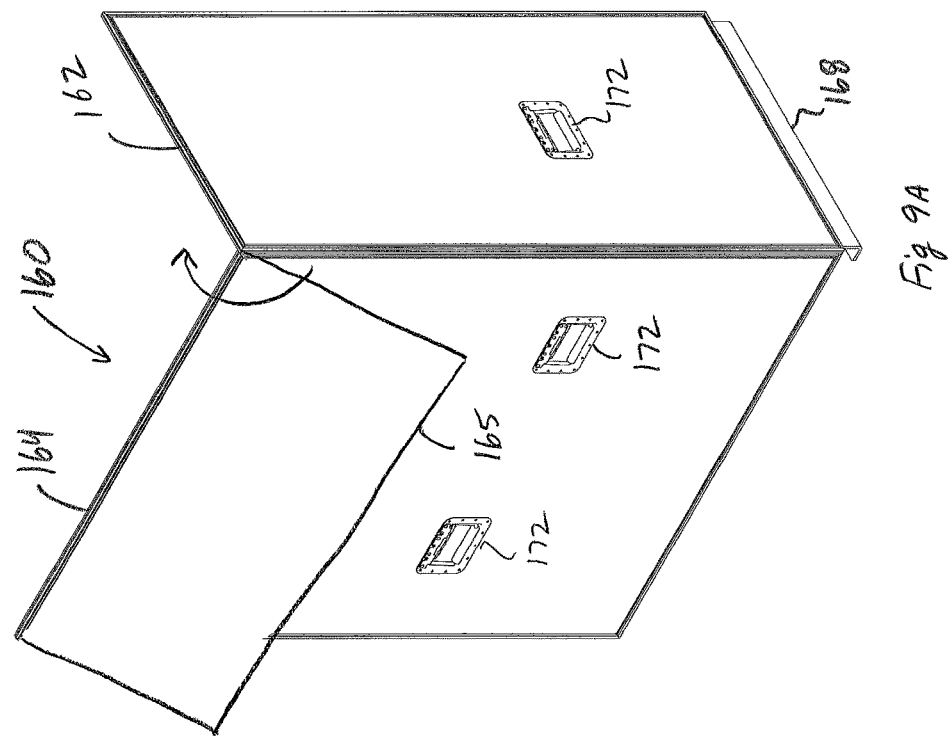

PORTABLE VIDEO SCREEN

TECHNICAL FIELD

The present invention relates generally to portable video screens, and more specifically to portable video screens that unfold and link together to form a backdrop or display.

DESCRIPTION OF THE PRIOR ART

Conventional video screens typically are fixed in place. Modular video boards are well known and feature display panels installed in situ. For example, a large sporting event may require additional video displays using a plurality of individual displays ganged together. Typically a frame is located in the installation area and modular display panels are installed. Once the event is over the process reversed until the next job. However, these systems are complicated and require expertise to configure and coordinate the installation of a large display from several dozen individual display panels. Furthermore, the system cannot be readily moved from one installation to another. Thus, there exists significant room for improvement in the art for overcoming these and other shortcomings of portable video screens.

BRIEF DESCRIPTION OF THE DRAWINGS

The novel features believed a characteristic of the embodiments of the present application is set forth in the appended claims. However, the embodiments themselves, as well as a preferred mode of use, and further objectives and advantages thereof will best be understood by reference to the following detailed description when read in conjunction with the accompanying drawings, wherein:

FIG. 8 is a perspective view of four video units connected together according to the present application.

FIGS. 9A and 9B are front and rear perspective views of an alternative embodiment of a transport case according to the present application.

Figure 1A:
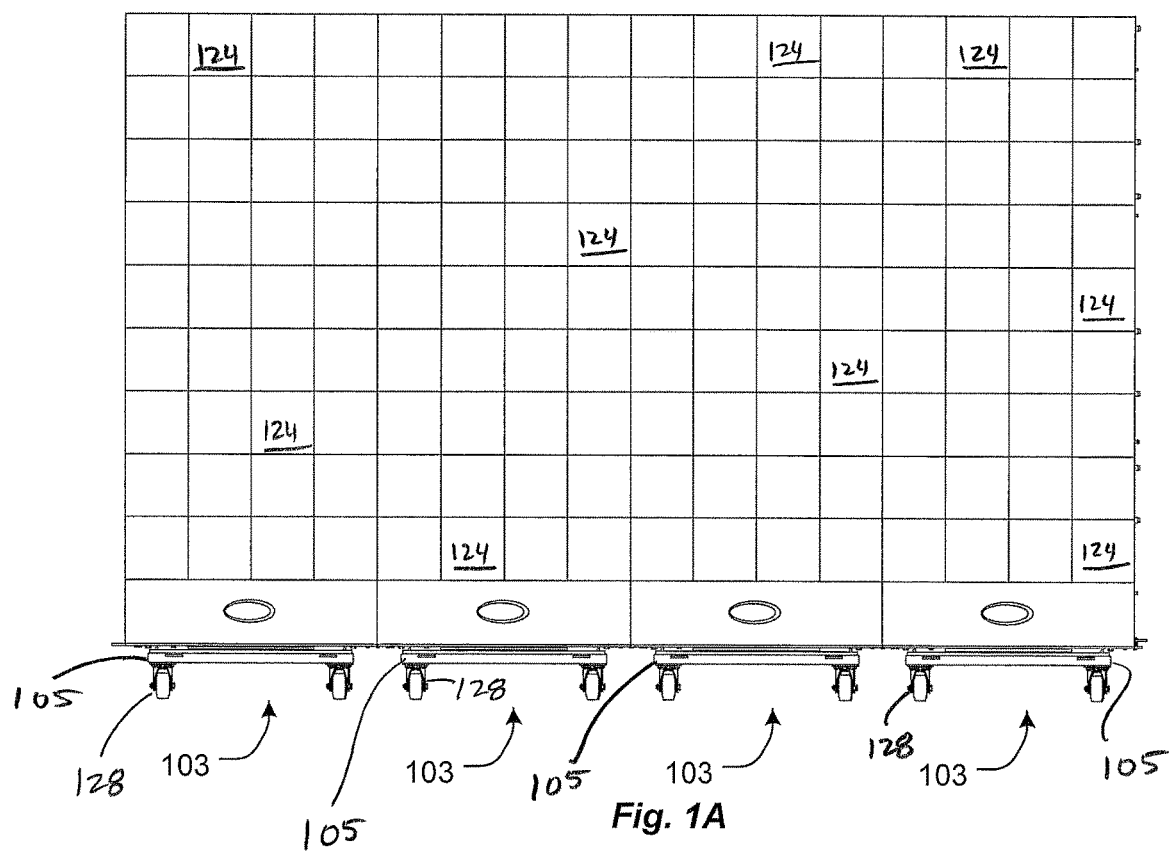
FIG. 1A is a front view of a deployed portable video screen according to the present application.
Figure 1B:
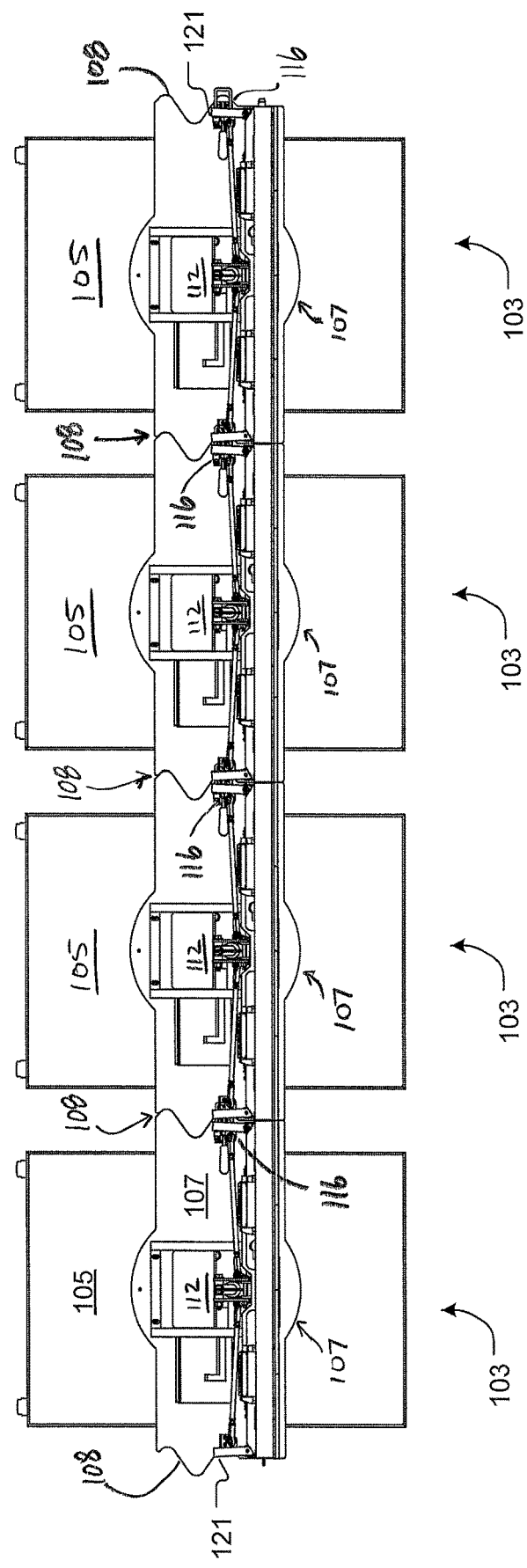
FIG. 1B is a top view of a deployed portable video screen according to the present application.
Figure 1C:
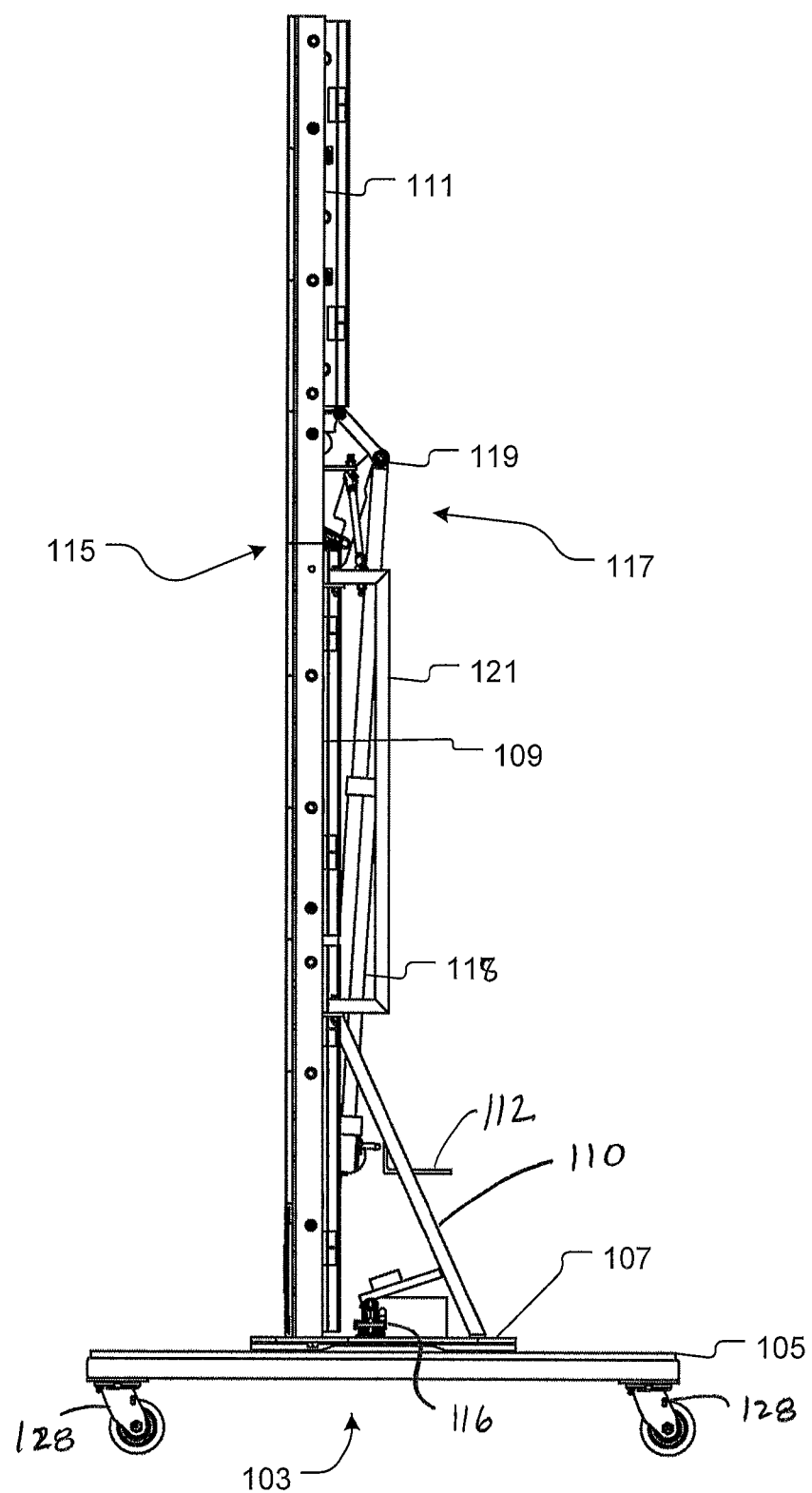
FIG. 1C is a side view of a deployed portable video screen according to the present application.
Figure 1D:
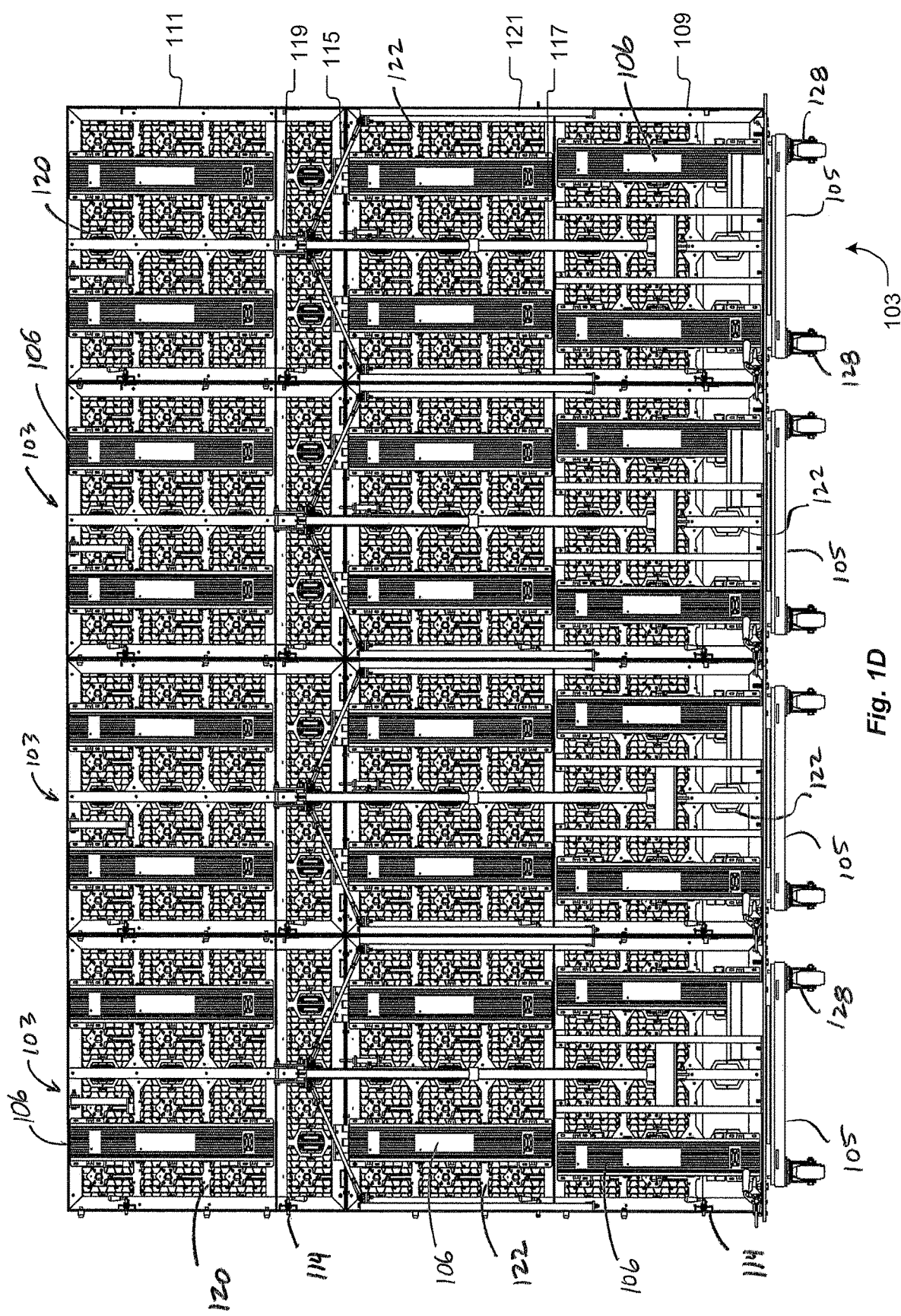
FIG. 1D is a back view of a deployed portable video screen according to the present application.
Figure 1E:
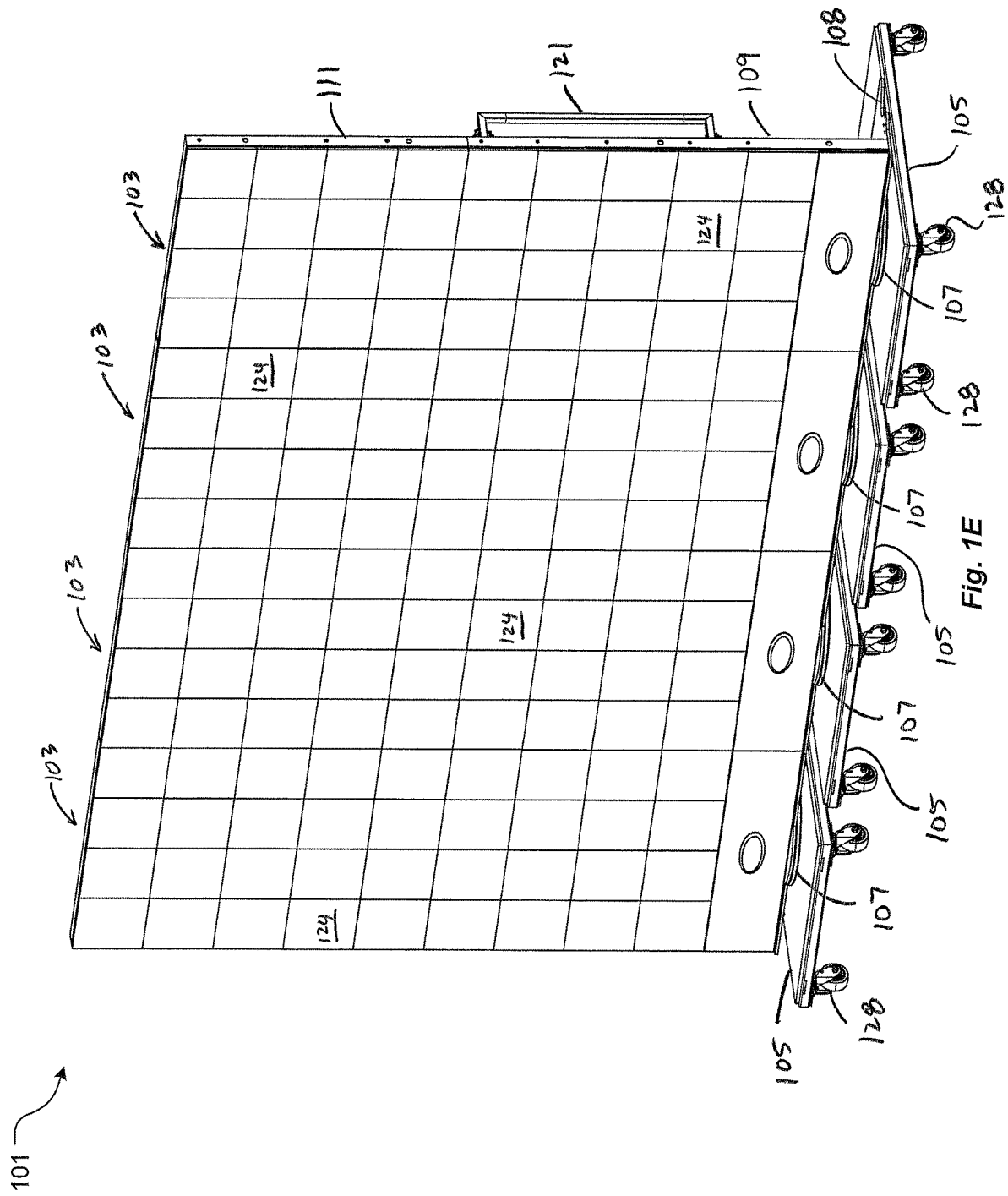
FIG. 1E is a perspective view of a deployed portable video screen according to the present application.

While the assembly and method of the present application are susceptible to various modifications and alternative forms, specific embodiments thereof have been shown by way of example in the drawings and are herein described in detail. It should be understood, however, that the description herein of specific embodiments is not intended to limit the invention to the particular embodiment disclosed, but on the contrary, the intention is to cover all modifications, equivalents, and alternatives falling within the spirit and scope of the present application as defined by the appended claims.

DESCRIPTION OF THE PREFERRED EMBODIMENT

Illustrative embodiments of the portable video screen are provided below. It will, of course, be appreciated that in the development of any actual embodiment, numerous implementation-specific decisions will be made to achieve the developer's specific goals, such as compliance with assembly-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The system and method of the present application will be understood, both as to its structure and operation, from the accompanying drawings, taken in conjunction with the accompanying description. Several embodiments of the system are presented herein. It should be understood that various components, parts, and features of the different embodiments may be combined together and/or interchanged with one another, all of which are within the scope of the present application, even though not all variations and particular embodiments are shown in the drawings. It should also be understood that the mixing and matching of features, elements, and/or functions between various embodiments is expressly contemplated herein so that one of ordinary skill in the art would appreciate from this disclosure that the features, elements, and/or functions of one embodiment may be incorporated into another embodiment as appropriate, unless described otherwise.

A portable video screen according to the present application comprises a large LED video screen that is formed by connecting several individual foldable video units together. Each video unit folds over itself for easy transportation in a transport case. The transport case is sized to fit through a standard 32" doorway. The video units are preferably arranged and connected together in a side-by-side configuration, using four video units; however, it will be appreciated that any number of video units, including a single video unit, may be utilized. The walls of the transport case are removed and the video unit is rotated 90 degrees about a base unit. Then, an electric motor or actuator is used to unfold the video unit. Once multiple video units are unfolded, they are connected together and secured into place with ratchet-type clamps. Each base unit includes a selectively shaped alignment guide member, including serpentine-shaped guide members, that ensures that adjacent base units fit together precisely. Each video unit also includes precision guide pins along its edges to ensure that the LED panels between adjacent video units are properly aligned. The alignment guide members guide the base units together until the guide pins take over. Each video unit is formed by connecting multiple LED panels onto a unique "face sheet."

The LED panels are conductively coupled to corresponding power supplies in at least two different ways: (1) along the edges of rear side of the LED panel with cables having pin-mount connectors; or (2) at the center of the rear side of the LED panel with a hard-wired or pin-mount connection. If the user chooses the latter, then the edge connectors are covered up by a small cover plate. The center connection is more desirable, as it eliminates the risk of pins being bent while connecting the cables to the edge connectors. Each face sheet includes a pattern of selective-shaped openings, preferably hexagonally-shaped openings, and is attached to support frames of each video unit. These hexagonally-shaped openings, which of course could be of different geometric shapes, are spaced to accommodate the cover plates of the unused edge connectors of each LED panel. In addition, the face sheet pattern allows for placement of alignment holes to receive alignment pins on the back of each LED panel, and, in some embodiments, for placement of holes to receive fasteners for fastening the power supply modules to the face sheet. Pivoting handles move from a deployed position to a retracted position as the video unit is unfolded. This ensures that the user does not have to touch the LED panels to move each video unit, and ensures that the handles do not touch each other when the video units are connected together.

Referring now to FIGS. 1A-1E in the drawings, a preferred embodiment of a portable video system 101 deployed in a display configuration according to the present application is illustrated. Video system 101 is comprised of a plurality of video units 103 coupled together to form a large portable video screen. Each video unit 103 is comprised of a rolling base unit 105, a rotating base assembly 107, a lower frame 109, an upper frame 111, a pivoting system 117, an upper face sheet 120, a lower face sheet 122, a plurality of LED panels 124 (not all are numbered), one or more power supplies 106, and one or more motors, controllers, and switches for actuating video units 103. The exposed edges of the lower frame 109 and upper frame 111 comprise alignment pins, alignment holes, and clamps as required to rigidly form a portable screen of multiple carts.

Rotating base assembly 107 is rotatably coupled to the rolling base 105 by a bearing, such that lower frame 109 and upper frame 111 may rotate relative to base unit 105. Lower frame 109 preferably includes one or more locking pins to lock lower frame 109 in selected positions, such as a transport position and a display position. It will be appreciated that other selected positions may be utilized, depending upon the desired application and viewing angle. As is shown, when each video unit 103 is rotated into the display position, the vertical edges of lower frames 109 and upper frames 111 extend beyond the edges of rolling base units 105. This configuration ensures that the side edges of LED panels 124 on adjacent video units 103 are allowed to form a very tight fit. Rotating base assembly 107 features a first end and a second end, each having a selected alignment pattern 108, such as a serpentine shape or a rhombus shape. Alignment pattern 108 facilitates the alignment of one video unit 103 to another, as video units 103 are moved closer to each other. Once video units 103 are moved into connection with each other, then adjacent video units 103 are precisely secured together via a latching system. The latching system preferably includes various clamps and alignment devices, such as lower cam-over clamps 116 disposed on rotating base assembly 107, and upper pin-and-socket clamps 114 along the vertical rails of lower frame 109 and upper frame 111. This unique latching system ensures that LED panels 124 are properly and precisely aligned across one video unit 103 to another, without crushing or damaging LED panels 124. It will be appreciated that other suitable connection devices, may be used to couple adjacent video units 103 tightly and precisely together. Once fully assembled, portable video system 101 can be moved as a single unit into a final viewing position.

Lower frame 109 is rigidly attached to rotating base assembly 107 and is supported by angled support members 110 to provide strength. One or more steps 112 may be included on support member 112 so that the user may reach upper fastening and/or alignment features. Upper frame 111 is pivotally connected to lower frame 109 by one or more hinges 115. Pivoting system 117 is comprised of an actuator 118, a linkage system 119, and one or more pivoting handles 121. As shown in FIGS. 1A-1E, handles 121 are located behind lower frame 109 and point away from the front of video unit 103. Pivoting handles 121 move from a deployed position to a retracted position as video unit 103 is unfolded. In the transport position, handles 121 rotate about ninety degrees to prevent inadvertent contact with the edges of video unit 103. This ensures that the user does not have to touch LED panels 124 to move each video unit 103, and ensures that handles 121 do not touch each other when video units 103 are connected together. Activation of actuator 117 folds, i.e., pivots, upper frame 111 relative to lower frame 109, and causes handles 121 to rotate from pointing to the sides to pointing to the back of the video unit 103.

Figure 2:
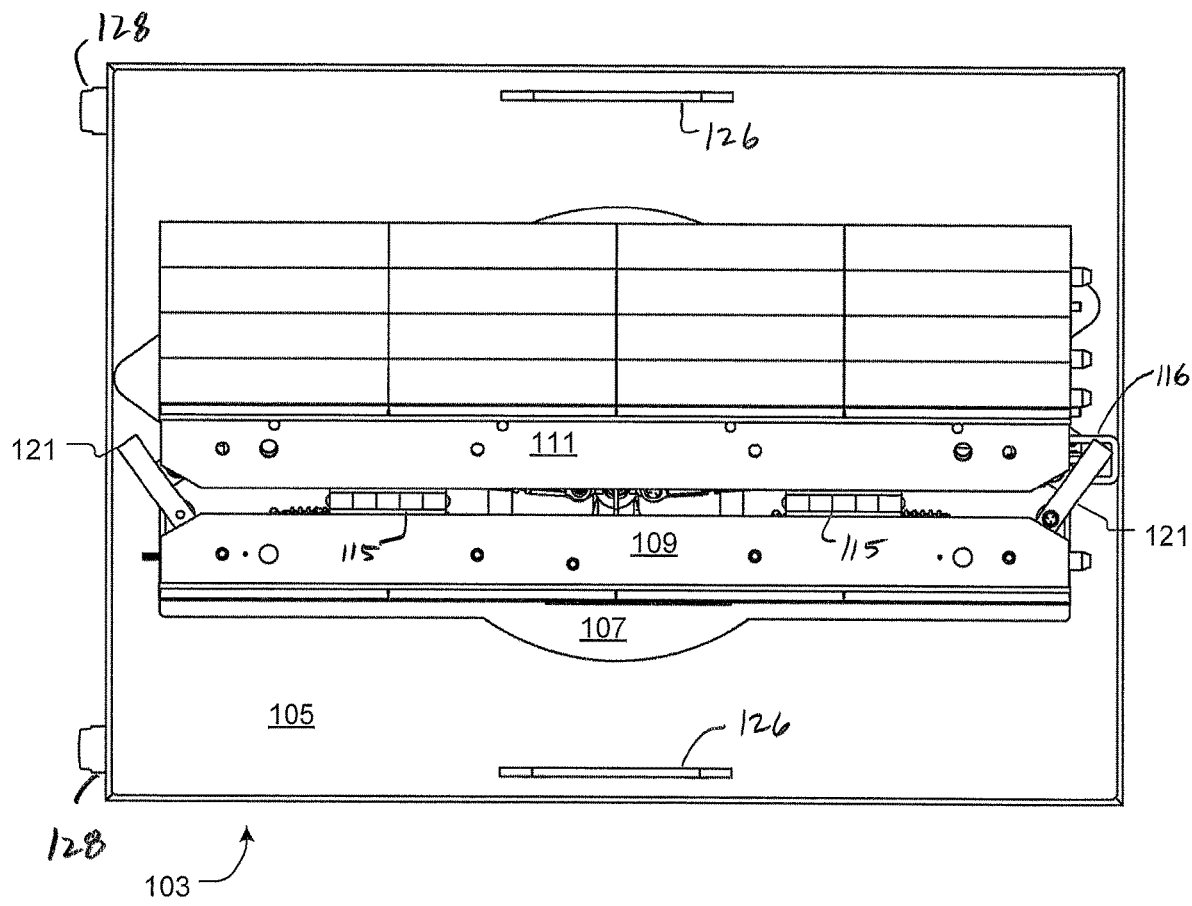
FIG. 2 is a top view of a deployed portable video screen partially rotated according to the present application.
Figure 3A:
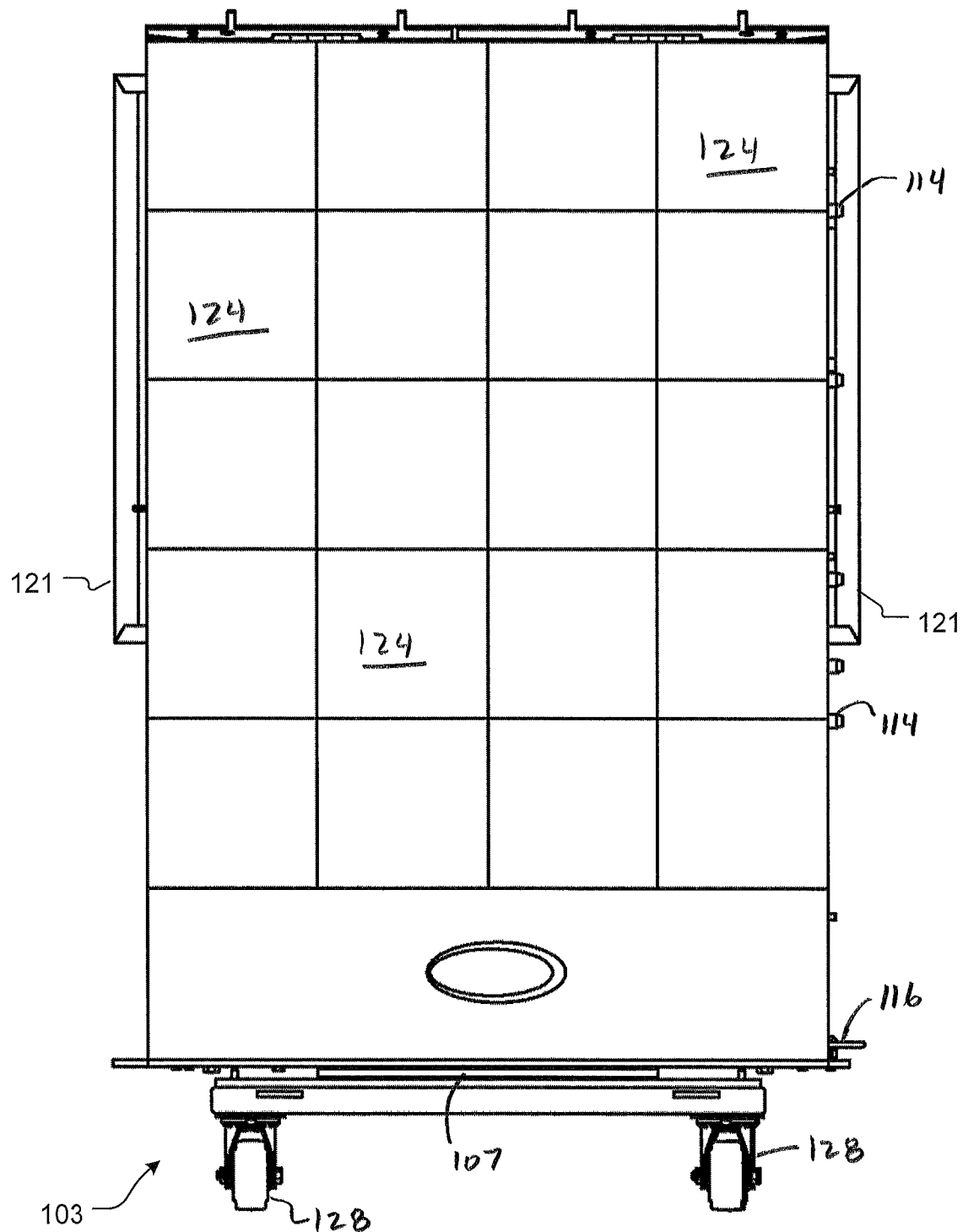
FIG. 3A is a front view of a folded portable video screen according to the present application.
Figure 3B:
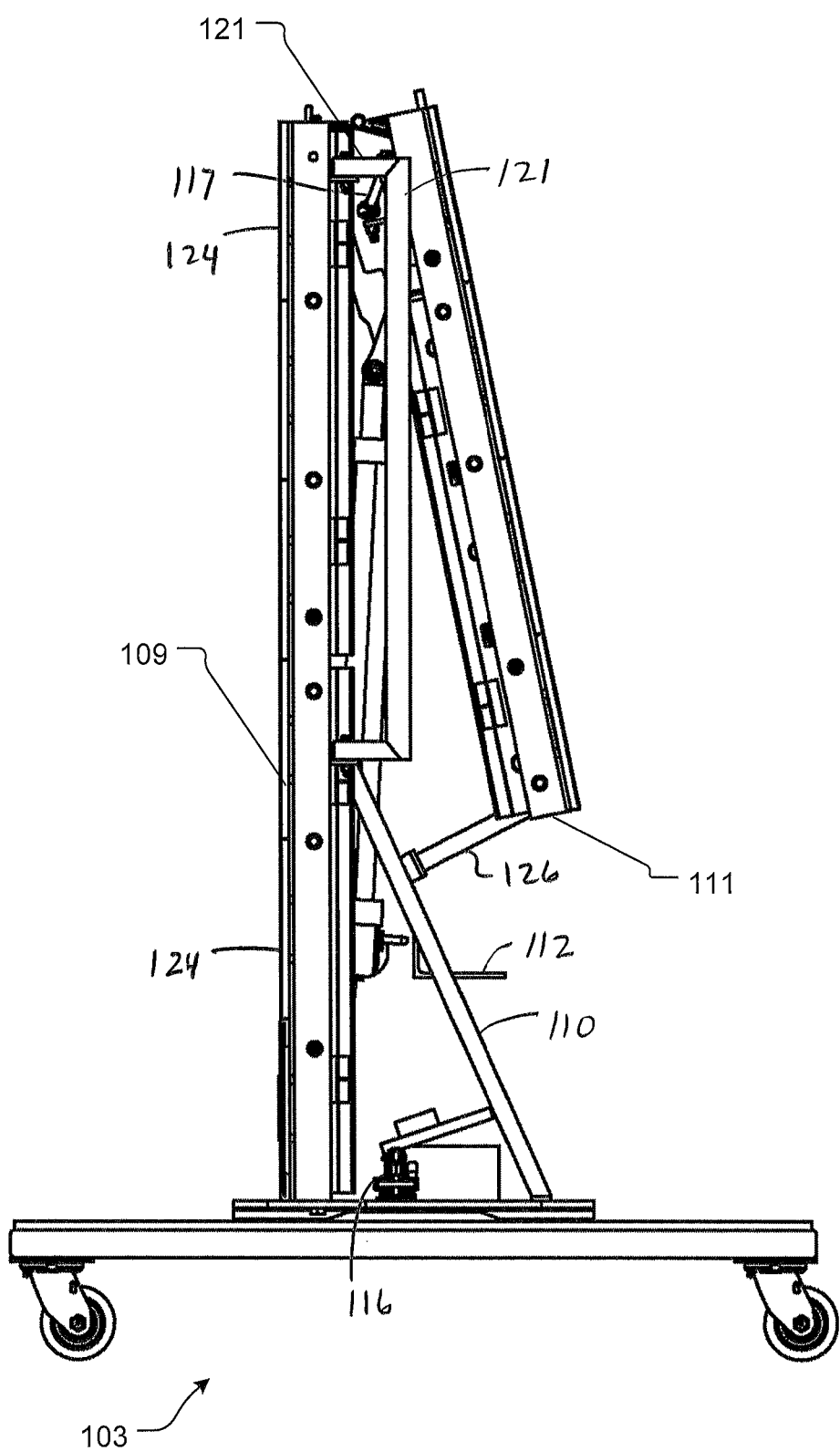
FIG. 3B is a side view of a folded portable video screen according to the present application.
Figure 3C:
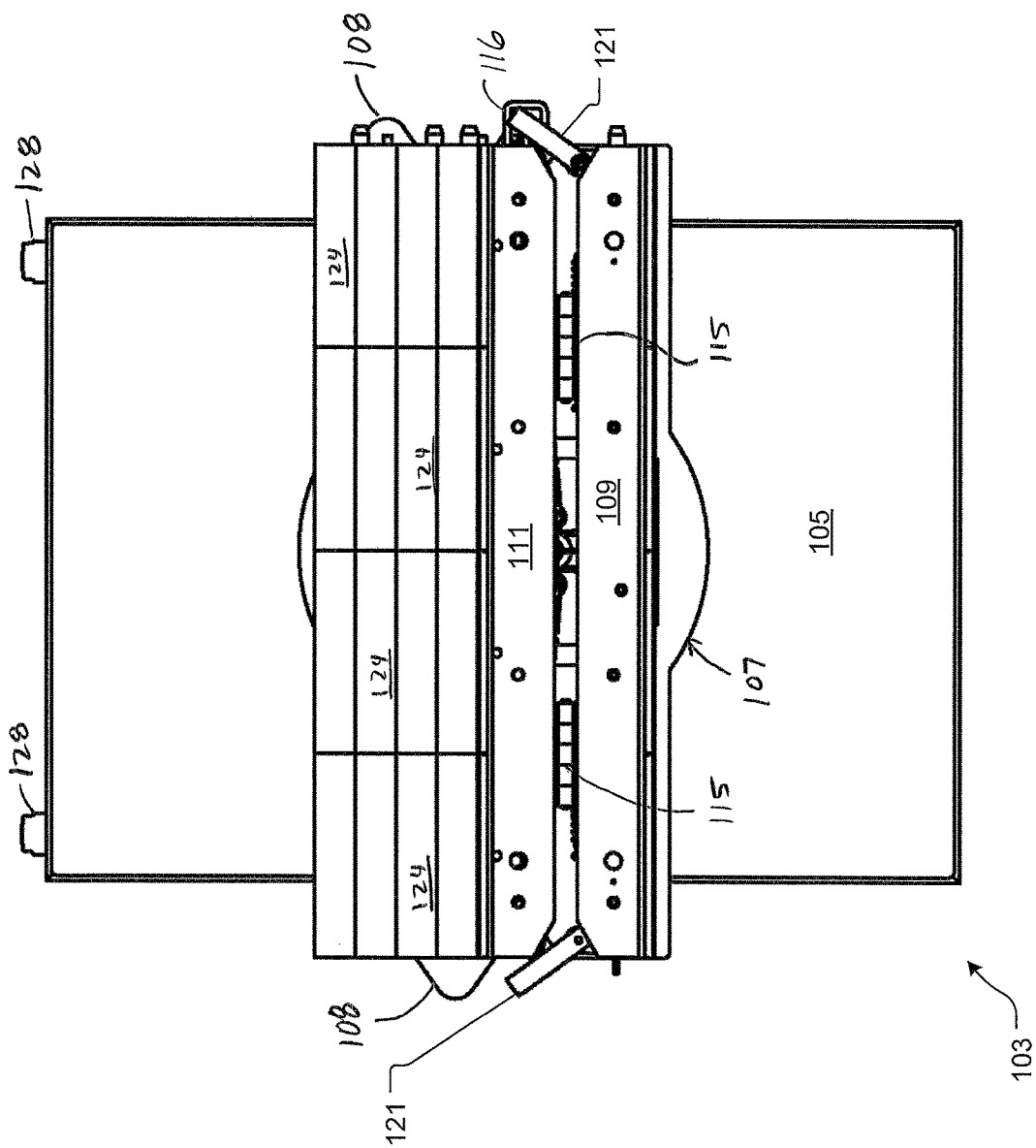
FIG. 3C is a top view of a folded portable video screen according to the present application.
Figure 3D:
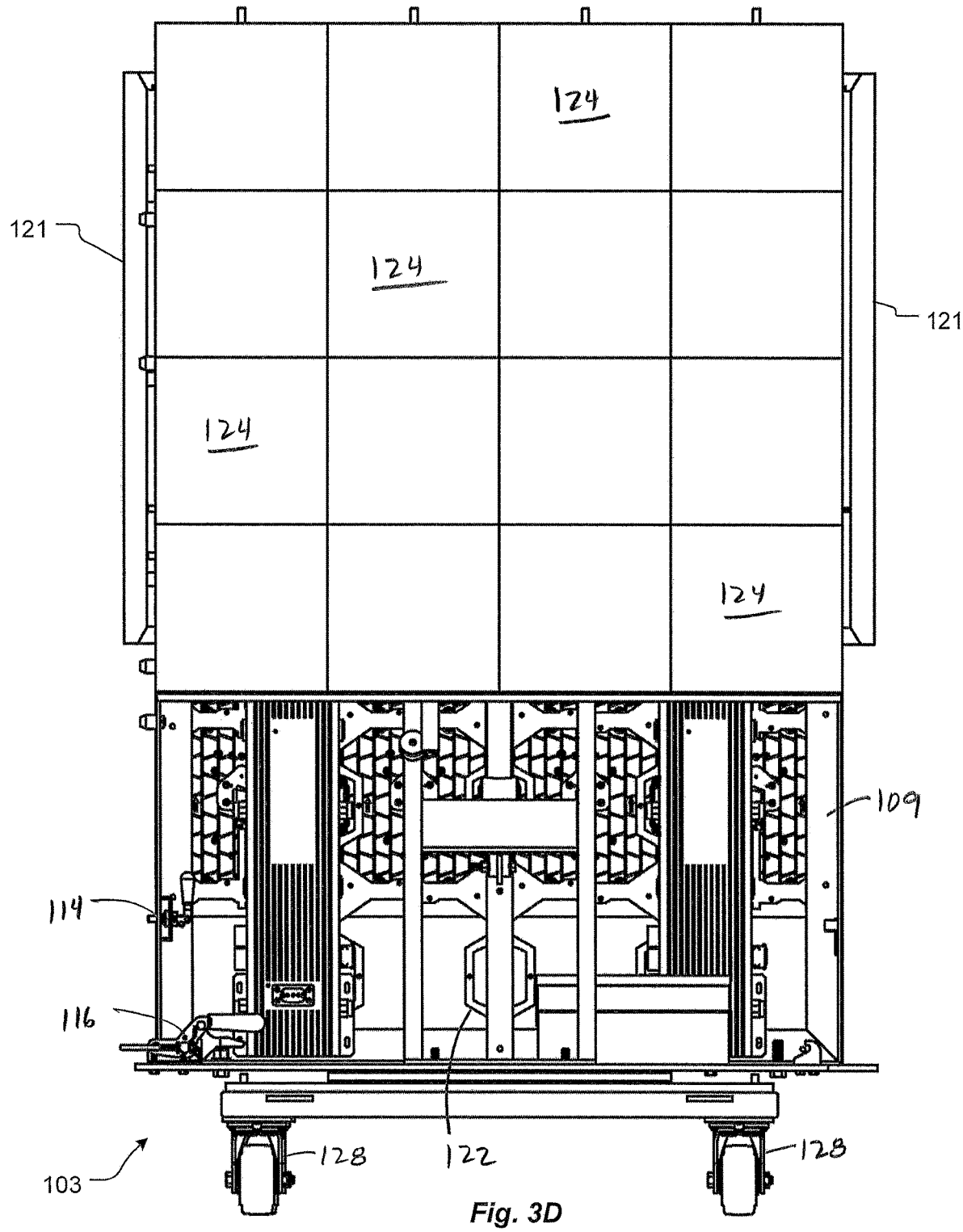
FIG. 3D is a back view of a folded portable video screen according to the present application.
Figure 3E:
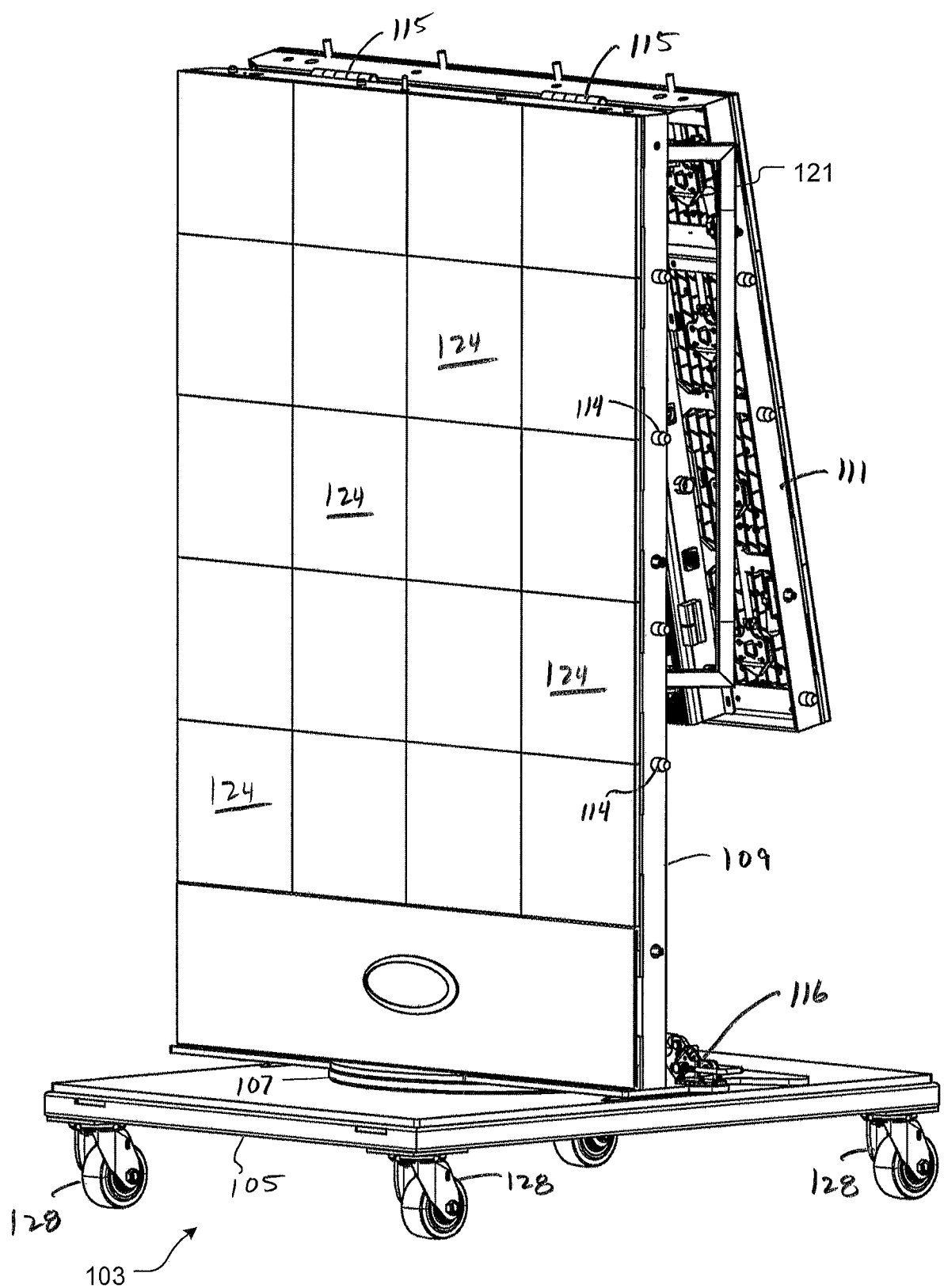
FIG. 3E is a perspective view of a folded portable video screen according to the present application.
Figure 4C:
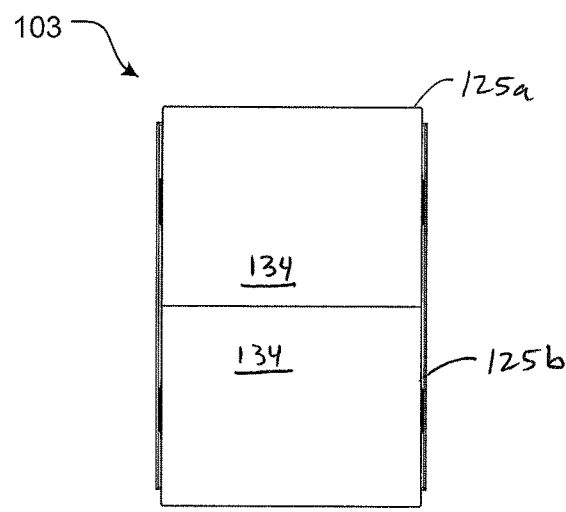
FIG. 4C is a top view of a folded portable video screen in a transport box according to the present application.
Figure 4B:
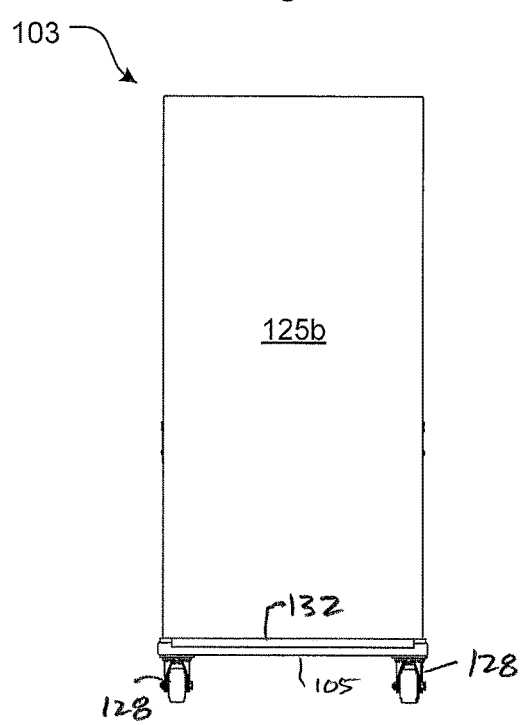
FIG. 4B is a side view of a folded portable video screen in a transport box according to the present application.
Figure 4A:
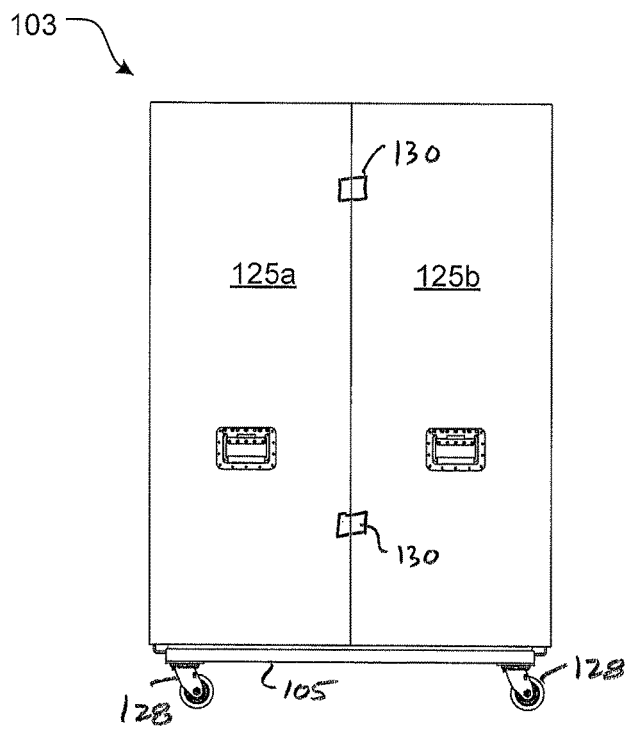
FIG. 4A is a front view of a folded portable video screen in a transport box according to the present application.
Figure 4D:
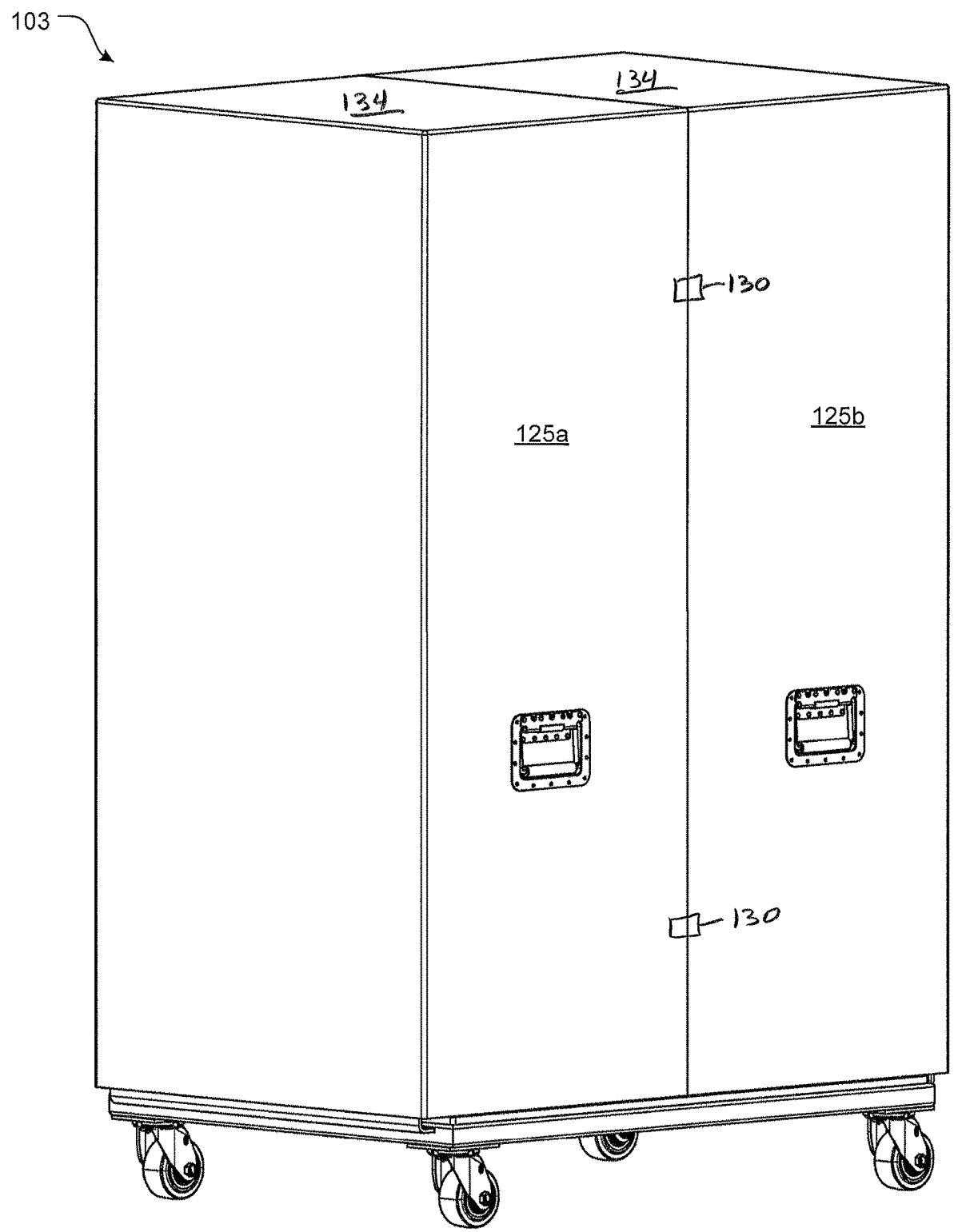
FIG. 4D is a perspective view of a folded portable video screen in a transport box according to the present application.

Referring now also to FIG. 2 in the drawings, portable video unit 103 is shown in a transport configuration. As is shown, video unit 103 is in the transportation position with a transport case 125a and 125b (see FIG. 5) removed. In the transport configuration, upper frame 111 is folded down relative to lower frame 109; handles 121 are exposed to enables users to move video unit 103 without touching LED panels 124; and rotating base assembly 107 is aligned with rolling base unit 105, so that the edges of LED panels 124 are within the area of rolling base unit 105. This clearance ensures that LED panels 124 do not get damaged during transport. Base unit 105 may include one or more guide members 126 that assist in aligning and attaching transport case 125a and 125b. In addition, guide members 126 may also be used to attach and align front and rear decorative covers for covering casters 128.

Referring now also to FIGS. 3A-3E in the drawings, portable video unit 103 is shown a folded configuration with transport case removed and rotating base assembly 107 rotated ninety degrees relative to base unit 105. Handles 121 are exposed to enables users to move the video unit 103 without touching LED panels 124. Upper frame 111 is rotated down relative to lower frame 109, and rotating base assembly 107 is perpendicular to rolling base unit 105, so that the edges of LED panels 124 of video unit 103 are not within the area of rolling base unit 105. A pivoting bump stop 126 drops down as upper frame 109 is lowered to ensure that linkage system 119 does not have to carry the full load of upper frame 109.

Referring now also to FIGS. 4A-4D in the drawings, portable video unit 103 is shown stored in the folded mode in transport case 125*a* and 125*b*. Transport case is comprised of a first member 125*a* and a second member 125*b*. In this embodiment, first member 125*a* and second member 125*b* each include an integral top portion 134. First member 125*a* is removable coupled to second member 125*b* with one or more quick-release latches 130. Furthermore, transport case 125*a* and 125*b* is coupled to rolling base unit 105 with latches and/or catch-tabs 132. Upper frame 111 and lower frame 109 do not contact the transportation shell because the rotating base 107 is pinned to protect the edges of the display in the area of the rolling base 105.

Figure 5:
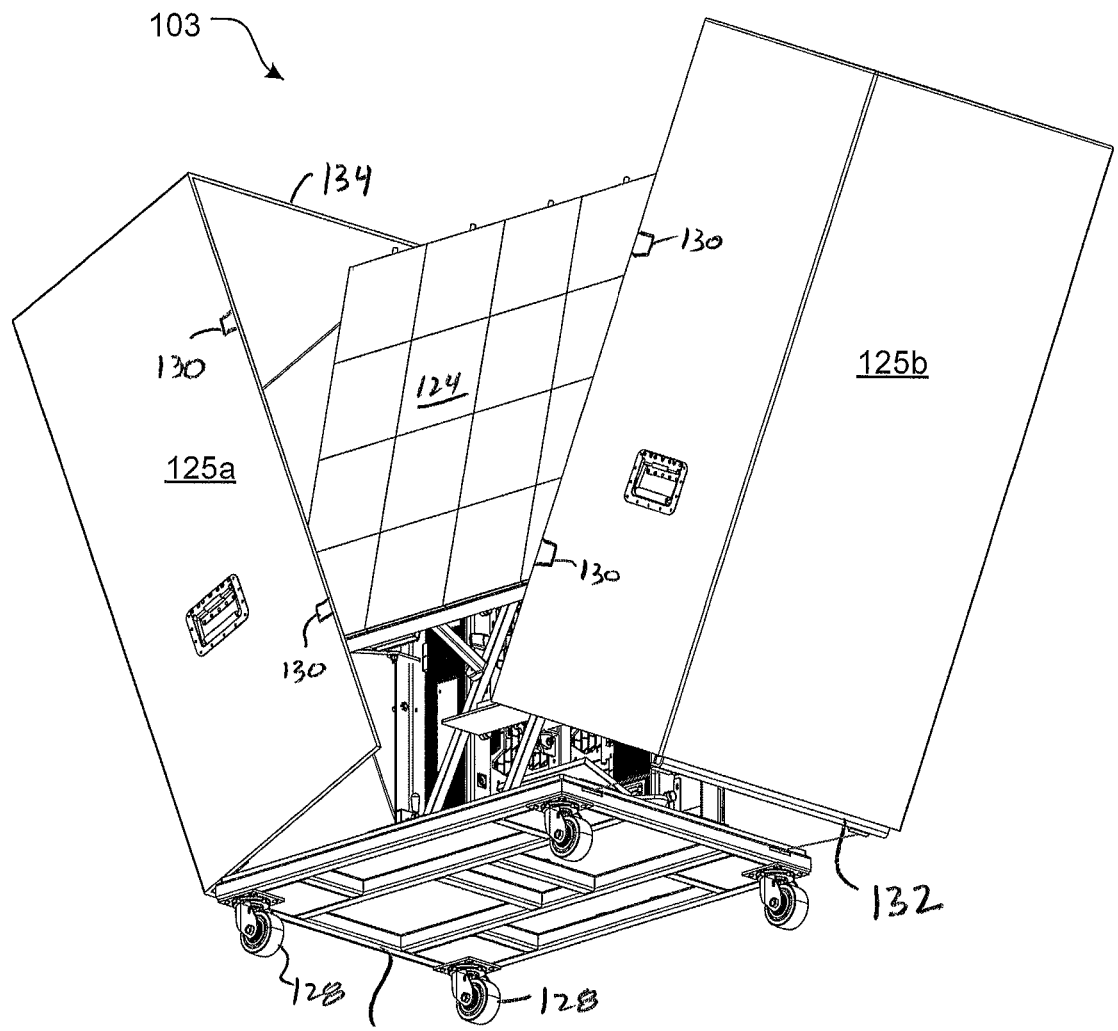
FIG. 5 is a perspective view of a folded portable video screen in a partially open transport box according to the present application.

Referring now also to FIG. 5 in the drawings, portable video unit 103 is shown in the folded mode with transport case 125*a* and 125*b* shown in a partially open mode. Transport case 1125*a* and 125*b* includes sufficient clearance such that lower frame 109, upper frame 111, and LED panels 124 do not come into contact with transport case 125*a* and 125*b*. In addition, transport case 125*a* and 125*b* includes sufficient clearance to store additional parts and components, such as decorative covers, cover frames, etc.

Figure 6B:
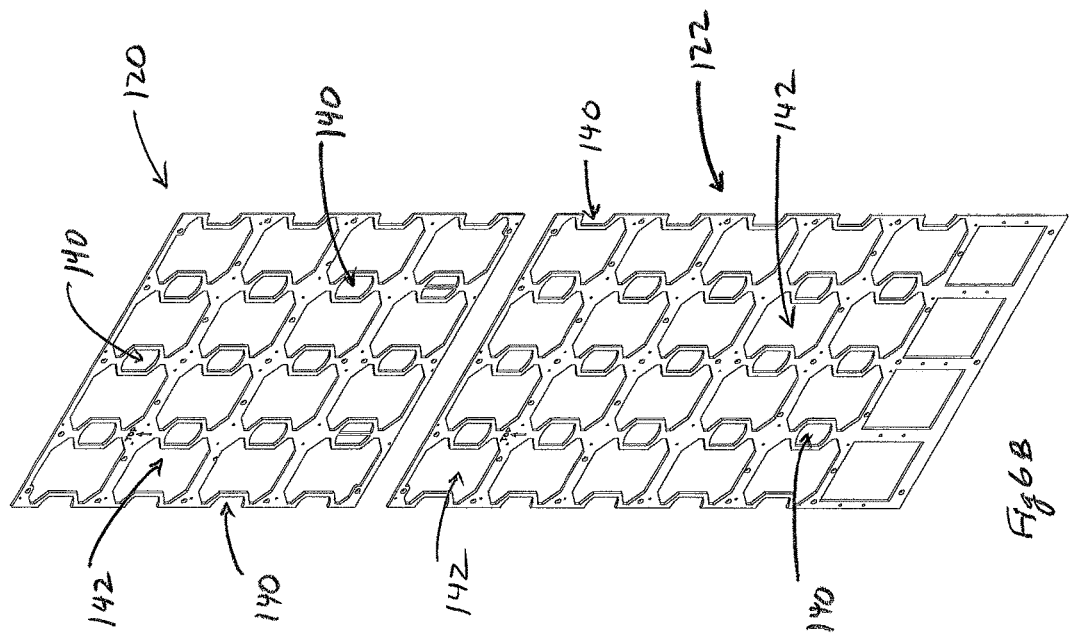
FIGS. 6A and 6B are front views and perspective views, respectively, of face sheets for holding LED panels according to the present application.
Figure 6A:
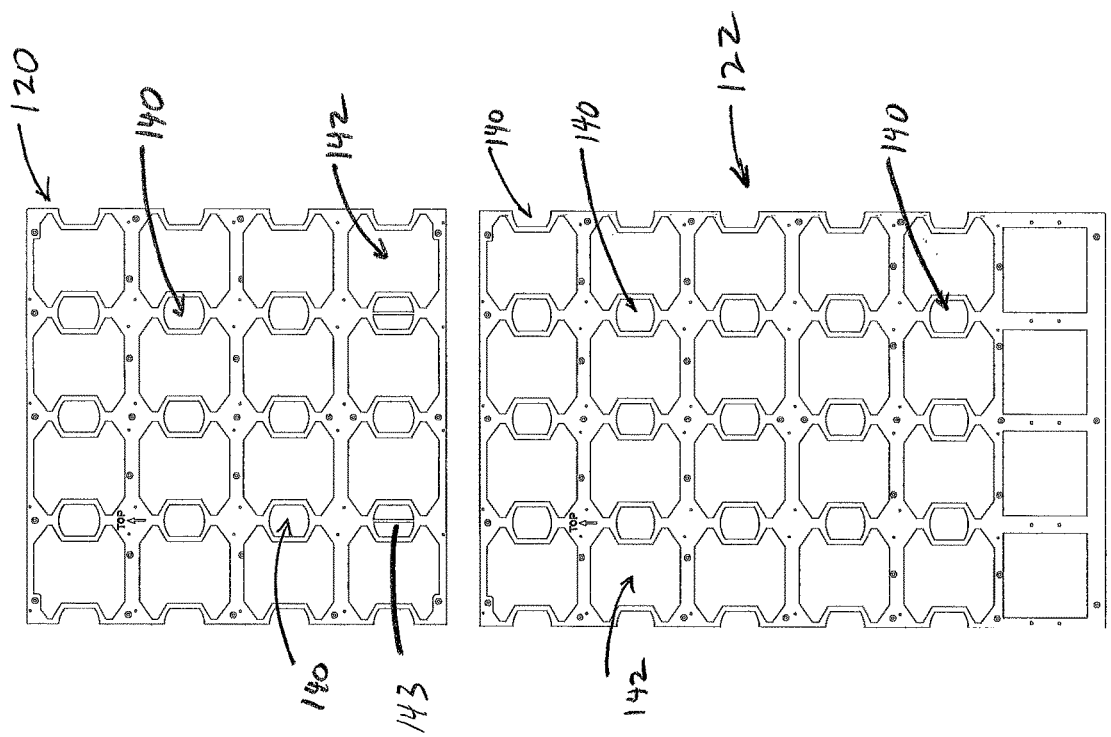

Referring now also to FIGS. 6A and 6B in the drawings, upper face sheet 120 and lower face sheet 122 are illustrated in front views and perspective views, respectively. Upper face sheet 120 is configured for attachment to upper frame 111, and lower face sheet 122 is configured for attachment to lower frame 109. Upper face sheet 120 and lower face sheet 122 are formed of a thin structural material and each includes a pattern of selective-shaped openings, preferably hexagonally-shaped openings 140. Hexagonally-shaped openings 140, which of course could be of different geometric shapes, are spaced to accommodate the cover plates of the unused edge connectors of each LED panel 124. Upper face sheet 120 and lower face sheet 122 each also includes a pattern of selective-shaped openings 142 which are sized and shaped to allow access to LED panels 124 form the rear. Openings 142 are large enough for an LED panel 124 to be inserted and/or serviced through opening 142, without removing additional LED panels 124. Upper face sheet 120 and lower face sheet 122 include a plurality of alignment holes to receive alignment pins on the back of each LED panel, and, in some embodiments, additional mounting holes to receive fasteners for fastening the power supply modules to upper face sheet 120 and lower face sheet 122.

Upper face sheet 120 and lower face sheet 122 are preferably made of a metallic material, or include metallic connection points, such that LED panels 124 may be magnetically connected to upper face sheet 120 and lower face sheet 122; It will be appreciated that upper face sheet 120 and lower face sheet 122 may be of different sizes and shapes to accommodate various sizes and shapes of video screens. In addition, such face sheets may be used in a wide variety of video screens, including large LED screens, LED TV's, scoreboards, basketball scoring tables, etc. Upper face sheet 120 and lower face sheet 122 may include one or more ribs 143 to ensure that light does not pass through adjacent LED panels 124.

Figures 7A, 7B:
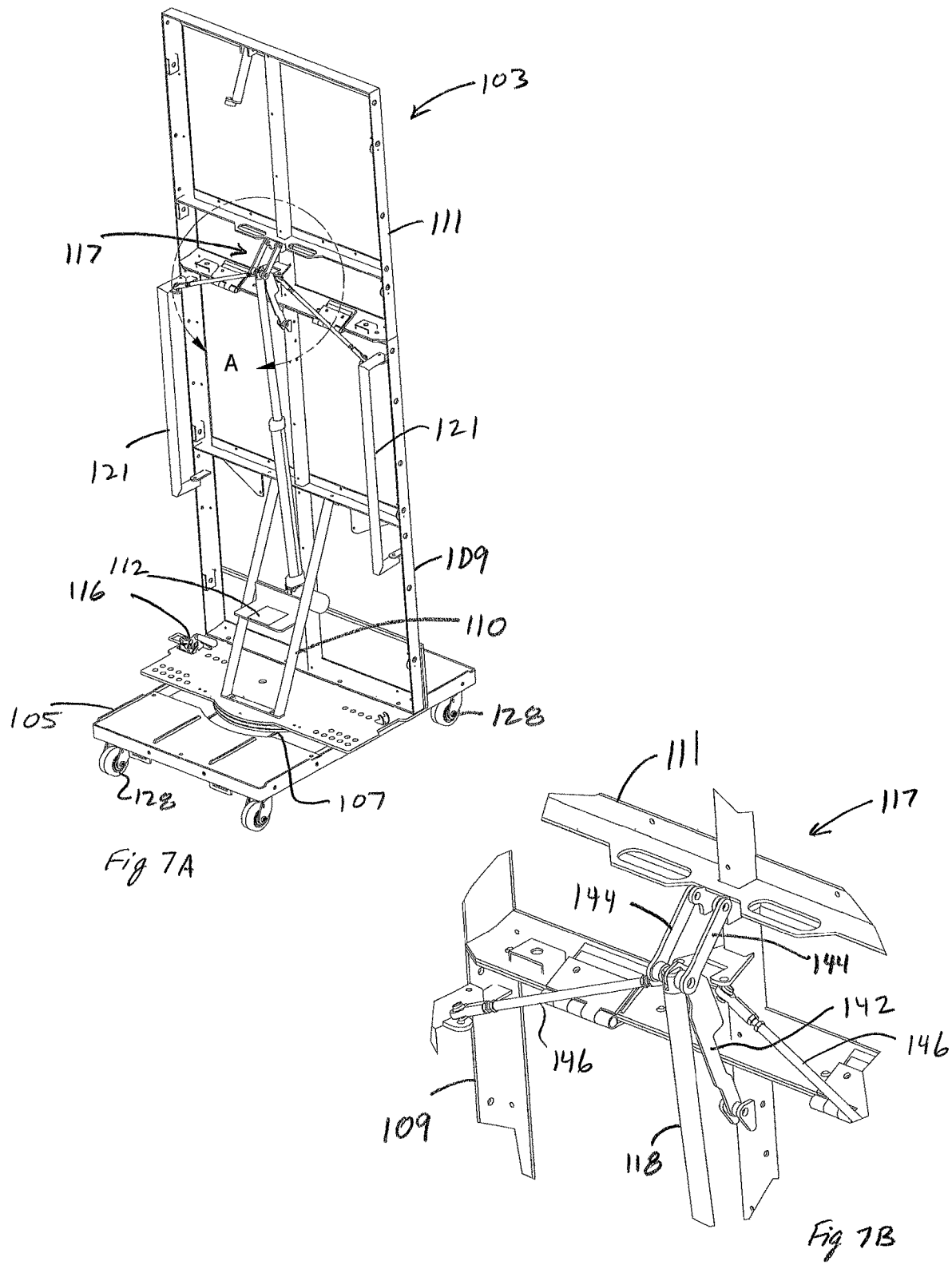
FIG. 7A is a perspective view of a frame for a video unit according to the present application.
FIG. 7B is an enlarged detailed view of portion A of FIG. 7A.

Referring now also to FIGS. 7A and 7B in the drawings, lower frame 109 and upper frame 111 are illustrated with various components removed to better illustrate pivoting system 117, actuator 118, and linkage system 119. Actuator 118 preferably includes an electric motor and an actuator arm. Other types of actuators may be used for actuator 118. As best seen in FIG. 7B, linkage system includes a main link 142, one or more upper links 144, and one or more handle links 146. Linkage system 119 may include additional components, such as pins, bearings, and adjustment components. Movement of the arm of actuator 118 moves main link 142, which in turn, moves upper links 144, and handle links 146. Movement of upper links 144 causes upper frame 111 to fold up and down relative to lower frame 109. Similarly, movement of handle links 146 causes handles 121 to pivot in and out. All of these movements are coordinated, such that a single switch may be used to move video unit 103 between a retracted position in which upper frame is folded down toward lower frame and a deployed position in which upper frame is extended upward into a position in which upper frame is coplanar with lower frame.

Referring now also to FIG. 8 in the drawings, an optional rear cover frame 150 is illustrated. In some applications it is desirable that the rear of video unit 103 be covered to prevent unauthorized access to the components, to protect the components from exposure to the elements (particularly when video unit 103 is being used in an outdoor application), to improve the aesthetic appearance of video unit 103, and/or to provide promotional indicia on the rear of video unit 103. Rear cover frame 150 includes one or more upright members 152, one or more upper cross members 154, one or more lower cross members 155, one or more attachment brackets 156, and one or more attachment clamps 158. It will be appreciated that upright members 152, upper cross members 154, and lower cross members 155 may be formed from multiple sections for ease of storage and transport. Attachment brackets 156 are preferably quick-release type brackets that are connected to upper frames 111 and pivot down against upper frames 111 when not in use. Attachment clamps 158 are preferably configured to connect lower cross members 155 to rotating base assemblies 107. A cover material (not shown) is wrapped about rear cover frame 150 and attached at selected locations to conceal and protect the components of video unit 103. In the preferred embodiment, the cover material is preferably a flexible, stretchable cover material that is stretched over rear cover frame 150 and attached along the side rails of lower frame 109 and upper frame 111 at selected locations.

Referring now also to FIGS. 9A and 9B in the drawings, a transport case 160 according to an alternative embodiment of the present application is illustrated. Transport case 160 is a two-piece break-down case consisting of two similar portions (only one of which is shown in FIGS. 9A and 9B), each having a first side wall 162 and a second side wall 164. One half, such as the half shown in FIGS. 9A and 9B, includes a hinged top portion 165 hingedly connected to the top edge of second side wall 164 by one or more piano-type hinges. First side wall is 162 is hingedly connect to second side 164 by one or more quick-release type hinged brackets 166. Each half of transport case 160 is connected to base unit 105 by one or more connecting plates 168 and connecting pins 170. In addition, each half of transport case 160 is connected to the other half by clamps and/or fasteners (not shown). Similarly, top portion is connected to the other half member by clamps and/or fasteners. This unique break-down configuration allows first side wall 162, second side wall 164, and top portion 165 to be folded down upon each other, resulting in a generally flat assembly, that is easy to move and store. Transport case 160 preferably includes one or more handles 172.

It is apparent that a system with significant advantages has been described and illustrated. The particular embodiments disclosed above are illustrative only, as the embodiments may be modified and practiced in different but equivalent manners apparent to those skilled in the art having the benefit of the teachings herein. It is therefore evident that the particular embodiments disclosed above may be altered, modified, and/or combined, and all such variations are considered within the scope and spirit of the application. Accordingly, the protection sought herein is as set forth in the description. Although the present embodiments are shown above, they are not limited to just these embodiments but are amenable to various changes and modifications without departing from the spirit thereof.

The invention claimed is:

1. A portable video screen, comprising:
    a base unit;
    a rotating base assembly rotatably coupled to the base unit;
    a lower frame coupled to the rotating base assembly;
    a plurality of LED panels carried by the lower frame;
    an upper frame pivotally attached to the lower frame;
    a plurality of LED panels carried by the upper frame;
    a pivoting system for pivoting the upper frame up and down relative to the lower frame;
    an upper face sheet coupled to the upper frame for receiving the LED panels; and
    a lower face sheet coupled to the lower frame for receiving the LED panels.

2. The portable video screen according to claim 1, wherein the upper face sheet and the lower face sheet each comprise:
    a pattern of selectively shaped openings for receiving assemblies that protrude rearward from the LED panels, such that the LED panels remain flush with the upper face sheet and the lower face sheet.

3. The portable video screen according to claim 2, wherein the selectively shaped openings are generally hexagonally-shaped.

4. The portable video screen according to claim 1, further comprising:
    at least one panel alignment pin extending rearward from each LED panel; and
    a plurality of LED alignment holes disposed on the upper face sheet and the lower face sheet configured to receive the panel alignment pins;
    whereby the LED panels are precisely aligned on the upper face sheet and the lower face sheet.

5. The portable video screen according to claim 1, wherein each LED panel comprises:
    at least one magnet disposed on a rear surface thereof;
    wherein the LED panels are magnetically coupled to the upper face sheet and the lower face sheet.

6. The portable video screen according to claim 1, further comprising:
    at least one handle pivotally coupled to the pivoting system;
    wherein the handle rotates outward relative to the lower frame as the upper frame is folded down toward the lower frame, and the handle rotates inward relative to the lower frame as the upper frame is folded up away from the lower frame.

7. The portable video screen according to claim 1, wherein the base unit has a width that is less than about 32 inches.

8. The portable video screen according to claim 1, wherein the rotating base assembly comprises:
    a selected alignment pattern formed into at least one end, so as to align adjacent portable video screens.

9. The portable video screen according to claim 8, wherein the alignment pattern is a rhombus-shaped pattern.

10. The portable video screen according to claim 8, wherein the alignment pattern is a serpentine-shaped pattern.

11. The portable video screen according to claim 1, wherein the pivoting system comprises:
    a motor;
    an actuator coupled to the motor, the actuator having an actuator arm;
    a main link pivotally coupled between the actuator arm and the lower frame; and
    an upper link pivotally coupled between the actuator arm and the upper frame;
    wherein the upper frame folds up and down relative to the lower frame in response to movement of the actuator arm.

12. The portable video screen according to claim 1, further comprising:
    a bump stop coupled between the upper frame and the lower frame for supporting at least a portion of the weight of the upper frame when the upper frame is in a retracted position.

13. The portable video screen according to claim 1, further comprising:
    a latching system for precisely connecting one portable video screen to an adjacent portable video screen.

14. The portable video screen according to claim 13, wherein the latching system comprises:
    at least one cam-over latch disposed on the rotating base assembly;
    at least one pin-and-socket clamp disposed along vertical side rails of upper frame and lower frame.

15. The portable video screen according to claim 1, further comprising:
    a rear cover frame comprising:
        one or more attachment brackets coupled to the upper frame;
        one or more upper cross members releasably coupled to the attachment bracket;
        one or more lower cross members releasably coupled to the rotating base assembly; and
        one or more upright members releasably coupled between the upper cross member and the lower cross member; and
    a cover material wrapped about the rear cover frame.

16. The portable video screen according to claim 1, further comprising:
    a break-down transport case comprising:
        a first-half member comprising:
            a first side wall;
            a second side wall hingedly coupled to the first side wall; and
            a top portion hingedly coupled to the first side wall;
            a first connecting plate configured to connect the first-half member to the base unit; and
            a first set of connecting pins configured to connect the first-half member to the base unit;
        a second-half member comprising:
            a third side wall;
            a fourth side wall hingedly coupled to the first side wall;
            a second connecting plate configured to connect the second-half member to the base unit; and
            a second set of connecting pins configured to connect the second-half member to the base unit; and
        one or latches for connecting the first-half member to the second-half member.

17. The portable video screen according to claim 16, wherein the first side wall is hingedly coupled to the second side wall by quick-release type hinged brackets, and the third side wall is hingedly coupled to the fourth side wall by quick-release type hinged brackets.

\* \* \* \* \*